(12) United States Patent
Toh et al.

(10) Patent No.: US 10,720,513 B2
(45) Date of Patent: Jul. 21, 2020

(54) OTP-MTP ON FDSOI ARCHITECTURE AND METHOD FOR PRODUCING THE SAME

(71) Applicant: GLOBALFOUNDRIES Singapore Pte. Ltd., Singapore (SG)

(72) Inventors: Eng Huat Toh, Singapore (SG); Shyue Seng Tan, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 134 days.

(21) Appl. No.: 15/917,147

(22) Filed: Mar. 9, 2018

(65) Prior Publication Data

US 2019/0280108 A1 Sep. 12, 2019

(51) Int. Cl.
| | |
|---|---|
| *H01L 29/66* | (2006.01) |
| *H01L 29/78* | (2006.01) |
| *H01L 27/112* | (2006.01) |
| *H01L 27/088* | (2006.01) |
| *H01L 27/12* | (2006.01) |

(Continued)

(52) U.S. Cl.
CPC ........ *H01L 29/66795* (2013.01); *H01L 21/84* (2013.01); *H01L 21/845* (2013.01); *H01L 27/0886* (2013.01); *H01L 27/115* (2013.01); *H01L 27/11206* (2013.01); *H01L 27/1203* (2013.01); *H01L 27/1211* (2013.01); *H01L 29/0653* (2013.01); *H01L 29/66545* (2013.01);
(Continued)

(58) Field of Classification Search
CPC ......... H01L 29/66545; H01L 29/66795; H01L 29/785; H01L 29/0649; H01L 21/02532
See application file for complete search history.

(56) References Cited

U.S. PATENT DOCUMENTS

| | | | | |
|---|---|---|---|---|
| 2009/0039426 A1* | 2/2009 | Cartier | ............. | H01L 21/28079 257/344 |
| 2013/0020623 A1* | 1/2013 | Tsui | .................. | H01L 27/11519 257/300 |
| 2017/0141235 A1* | 5/2017 | Lai | .................... | H01L 29/78391 |

FOREIGN PATENT DOCUMENTS

| | | |
|---|---|---|
| CN | 1450601 A | 10/2003 |
| TW | 200830470 A | 7/2008 |

(Continued)

OTHER PUBLICATIONS

Pan et al., "1Kbit FINFET Dielectric (FIND) RRAM in Pure 16nm FinFET CMOS Logic Process", Published in Electron Devices Meeting (IEDM), Dec. 2015 IEEE International, 4 pages.

(Continued)

*Primary Examiner* — Tony Tran
(74) *Attorney, Agent, or Firm* — Ditthavong & Steiner P.C.

(57) ABSTRACT

Methods of forming a compact FDSOI OTP/MTP cell and a compact FinFET OTP/MTP cell and the resulting devices are provided. Embodiments include forming a SOI region or a fin over a BOX layer over a substrate; forming a first and a second gate stack, laterally separated, over respective portions of the SOI region or the fin; forming a first and a second liner along each first and second sidewall and of the first and the second gate stack, respectively, the second sidewall over respective portions of the SOI region or the fin; forming a spacer on each first and second liner; forming a S/D region in the SOI region or the fin between the first and the second gate stack; forming a CA over the S/D region; utilizing each gate of the first gate stack and the second gate stack as a WL; and connecting a BL to the CA.

6 Claims, 8 Drawing Sheets

(51) Int. Cl.
*H01L 29/06* (2006.01)
*H01L 27/115* (2017.01)
*H01L 21/84* (2006.01)

(52) U.S. Cl.
CPC .... *H01L 29/785* (2013.01); *H01L 2029/7858* (2013.01)

(56) References Cited

FOREIGN PATENT DOCUMENTS

| TW | 201513304 A | 4/2015 |
|---|---|---|
| TW | 201707151 A | 2/2017 |
| TW | 201719820 A | 6/2017 |
| TW | 201740510 A | 11/2017 |

OTHER PUBLICATIONS

Hsiao et al., "A New High-Density Twin-Gate Isolation One-Time Programmable Memory Cell in Pure 28-nm CMOS Logic Process", Published in IEEE Transactions on Electron Devices, vol. 62, Issue: 1, Jan. 2015, 7 pages.

Office Action for the related Taiwanese Patent Application No. 107111869, dated Mar. 29, 2019, 6 pages.

* cited by examiner

OTP-MTP ON FDSOI ARCHITECTURE AND METHOD FOR PRODUCING THE SAME

TECHNICAL FIELD

The present disclosure relates to memory design for semiconductor devices. The present disclosure is particularly applicable to fabricating one-time programmable (OTP) and multiple-time programmable (MTP) memory devices.

BACKGROUND

A known high-density anti-fuse twin-gate isolation (TGI) OTP memory cell has been realized in a 28 nanometer (nm) high-k metal gate (HKMG) complimentary metal oxide semiconductor (CMOS) logic process to address breakdown between the gate and an n+ doped source/drain (S/D) region as well as program disturb/interference issues due to potential contour distribution. The 28 nm OTP technology addresses the program disturb issue by introducing a p+ implant; however, this results in a larger and less desirable cell size. A 1 kilobit fin-type field effect transistor (FinFET) dielectric (FIND) resistive random-access memory (RRAM) realized in a 16 nm FinFET CMOS logic process or a 16 nm MTP cell is also known. The 16 nm MTP technology has a very low set voltage and reset current due to the field enhancement on fin corners; however, a reduction of the cell size is desirable.

A need therefore exists for methodology enabling formation of a compact OTP/MTP on FDSOI or FinFET architecture that can alleviate program disturb and the resulting devices.

SUMMARY

An aspect of the present disclosure is a method of forming a compact FDSOI OTP/MTP cell.

Another aspect of the present disclosure is a method of forming a compact FinFET OTP/MTP cell.

A further aspect of the present disclosure is a compact FDSOI OTP/MTP device and a compact FinFET OTP/MTP device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a silicon-on-insulator (SOI) region or a fin over a buried oxide (BOX) layer over a substrate; forming a first gate stack and a second gate stack, laterally separated, over respective portions of the SOI region or the fin, the first gate stack and the second gate stack each having an oxide/high-k layer and a polysilicon gate layer or a metal gate layer; forming a first liner and a second liner along each first sidewall and second sidewall of the first gate stack and the second gate stack, respectively, the second sidewall over respective portions of the SOI region or the fin; forming a spacer on each first liner and second liner; forming a S/D region in the SOI region or the fin between the first gate stack and the second gate stack; forming a source/drain contact (CA) over the S/D region; utilizing each gate of the first gate stack and the second gate stack as a word line (WL); and connecting a bit line (BL) to the CA.

Aspects of the present disclosure include wherein the SOI region is formed, forming a first shallow trench isolation (STI) structure and a second STI structure through the BOX layer and a portion of the substrate on opposite sides of the SOI region prior to forming the first gate stack and the second gate stack, wherein the first gate stack and a first liner are formed over a portion of the first STI structure and the second gate stack and a first liner are formed over a portion of the second STI structure. Other aspects include forming the first gate stack and the second gate with the polysilicon gate layer by: forming a native oxide layer over the substrate; forming the oxide/high-k layer over the native oxide layer; forming a metal layer over the oxide/high-k layer; forming a polysilicon layer over the metal layer; and etching the polysilicon layer, the metal layer, the oxide/high-k layer, and the native oxide layer down to the SOI region and the first STI structure and the second STI structure, respectively, prior to forming the first liner and the second liner. Further aspects include forming the first gate stack and the second gate stack with the metal gate layer by: forming an oxide layer over the substrate; forming a dummy polysilicon layer over the oxide layer; etching dummy polysilicon layer and the oxide layer down to the SOI region and the first STI structure and the second STI structure, respectively, prior to forming the first liner and the second liner; removing a remaining portion of the dummy polysilicon layer and a remaining portion of the oxide layer subsequent to forming the S/D region, a trench formed; forming the oxide/high-k layer in a U-shape over the SOI region and along each sidewall of the trench; and filling the trench with the metal gate layer.

Additional aspects include wherein the fin is formed, forming the first gate stack and the second gate stack adjacent to a first sidewall and a second sidewall of the fin, respectively, the first sidewall and the second sidewall on opposite sides of the fin. Another aspect includes forming the first gate stack and the second gate with the polysilicon gate layer by: forming a native oxide layer over the substrate and along the first sidewall and the second sidewall of the fin; forming an oxide/high-k layer over the native oxide layer and along opposite sidewalls of the native oxide layer; forming a metal layer over the oxide/high-k layer and along opposite sidewalls of the oxide/high-k layer; forming a polysilicon layer over the metal layer and along opposite sidewalls of the metal layer; and etching the polysilicon layer, the metal layer, the oxide/high-k layer, and the native oxide layer down to the fin and the BOX layer, prior to forming the first liner and the second liner. Other aspects include forming the first gate stack and the second gate stack with the metal gate layer by: forming an oxide layer over the substrate and along the first sidewall and the second sidewall of the fin; forming a dummy polysilicon layer over the oxide layer and along opposite sidewalls of the oxide layer; etching dummy polysilicon layer and the oxide layer down to the fin and the BOX layer; removing a remaining portion of the dummy polysilicon layer and a remaining portion of the oxide layer subsequent to forming the S/D region, a trench formed; forming the oxide/high-k layer in a U-like shape over the fin and along each sidewall of the trench; and filling the trench with the metal gate layer. Further aspects include forming a raised source/drain (RSD) on the S/D region prior to forming the CA.

Another aspect of the present disclosure is a device including: a SOI region or a fin over a BOX layer over a substrate; a first gate stack and a second gate stack, laterally separated, over respective portions of the SOI region or the fin, the first gate stack and the second gate stack having a first oxide/high-k layer and a second oxide/high-k layer, respectively; a first liner and a second liner along each first sidewall and second sidewall of the first gate stack and the second gate stack, respectively, the second sidewall over respective portions of the SOI region or the fin; a spacer on each first liner and second liner; a S/D region in the SOI region or the fin between the first gate stack and the second gate stack; an ILD layer over the substrate; a CA through a portion of the ILD over the S/D region; and a BL connected to the CA.

Aspects of the device include wherein the SOI region is formed, a first STI structure and a second STI structure through the BOX layer and a portion of the substrate on opposite sides of the SOI region; wherein the first gate stack and a first liner are over a portion of the first STI structure and the second gate stack and a first liner are over a portion of the second STI structure. Other aspects include wherein the first gate stack and the second gate stack each further include: a first native oxide layer and a second native oxide layer over the portion of the first STI structure and the portion of the second STI structure, respectively; the first oxide/high-k layer and the second oxide/high-k layer over the first native oxide layer and the second native oxide layer, respectively; a first metal layer and a second metal layer over the first oxide/high-k layer and the second/high-k layer, respectively; a first polysilicon gate layer and a second polysilicon gate layer over the first metal layer and the second metal layer, respectively; and a first silicide layer and a second silicide layer over the first polysilicon gate layer and the second polysilicon gate layer, respectively, the first silicide layer and the second silicide layer coplanar with an upper surface of the first liner and the second liner. Further aspects include wherein the first gate stack and the second gate stack each further include: a first oxide layer and a second oxide layer over the portion of the first STI structure and the portion of the second STI structure, respectively; the first oxide/high-k layer and the second oxide/high-k layer over the first oxide layer and the second oxide layer; and a first metal gate layer and a second metal gate layer over the first oxide/high-k layer and the second oxide/high-k layer, wherein the first oxide/high-k layer and the second oxide/high-k layer comprises a U-shape and the first metal gate layer and the second metal gate layer completely fill the first oxide/high-k layer and the second oxide/high-k layer, respectively.

Another aspect includes wherein the fin is formed, the first gate stack and the second gate stack adjacent to a first sidewall and a second sidewall of the fin, respectively, the first sidewall and the second sidewall on opposite sides of the fin. Additional aspects include wherein the first gate stack and the second gate stack each further include: a first native oxide layer and a second native oxide layer adjacent to the first sidewall and the second sidewall of the fin, respectively, and over respective portions of the fin; the first oxide/high-k layer and the second oxide/high-k layer over and along the first native oxide layer and the second native oxide layer, respectively; a first metal layer and a second metal layer over and along the first oxide/high-k layer and the second/high-k layer, respectively; a first polysilicon gate layer and a second polysilicon gate layer over and along the first metal layer and the second metal layer, respectively; and a first silicide layer and a second silicide layer over the first polysilicon gate layer and the second polysilicon gate layer, respectively, the first silicide layer and the second silicide layer coplanar with an upper surface of the first liner and the second liner. Other aspects include wherein the first gate stack and the second gate stack each further include: a first oxide layer and a second oxide layer adjacent to the first sidewall and the second sidewall of the fin, respectively, and over respective portions of the fin; the first oxide/high-k layer and the second oxide/high-k layer over and along the first oxide layer and the second oxide layer; and a first metal gate layer and a second metal gate layer over and along the first oxide/high-k layer and the second oxide/high-k layer, wherein the first oxide/high-k layer and the second oxide/high-k layer is a U-like shape and the first metal gate layer and the second metal gate layer completely fill the first oxide/high-k layer and the second oxide/high-k layer, respectively. Additional aspects include a RSD between the S/D region and the CA.

A further aspect of the present disclosure is a method including: forming a SOI region over a BOX layer over a substrate; forming a first STI structure and a second STI structure through the BOX layer and a portion of the substrate on opposite sides of the SOI region; forming a first gate stack and a second gate stack, laterally separated, over a portion of the first STI structure and the second STI structure, respectively, and respective portions of the SOI region, the first gate stack and the second gate stack each having an oxide/high-k layer and a polysilicon gate layer or a metal gate layer; forming a first liner and a second liner along each first sidewall and second sidewall of the first gate stack and the second gate stack, respectively, the second sidewall over respective portions of the SOI region; forming a spacer on each first liner and second liner; forming a S/D region in the SOI region between the first gate stack and the second gate stack; forming a CA over the S/D region; utilizing each gate of the first gate stack and the second gate stack as a WL; and connecting a BL to the CA.

Aspects of the present disclosure include forming the first gate stack and the second gate with the polysilicon gate layer by: forming a native oxide layer over the substrate; forming the oxide/high-k layer over the native oxide layer; forming a metal layer over the oxide/high-k layer; forming a poly-silicon layer over the metal layer; and etching the polysilicon layer, the metal layer, the oxide/high-k layer, and the native oxide layer down to the SOI region and the first STI structure and the second STI structure, respectively, prior to forming the first liner and the second liner. Other aspects include forming the first gate stack and the second gate stack with the metal gate layer by: forming an oxide layer over the substrate; forming a dummy polysilicon layer over the oxide layer; etching the dummy polysilicon layer and the oxide layer down to the SOI region and the first STI structure and the second STI structure, respectively, prior to forming the first liner and the second liner; removing a remaining portion of the dummy polysilicon layer and a remaining portion of the oxide layer subsequent to forming the S/D region, a trench formed; forming the oxide/high-k layer in a U-shape over the SOI region and along each sidewall of the trench; and filling the trench with the metal gate layer. Further aspects include forming a RSD on the S/D region prior to forming the CA.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of program disturb and relatively large cell size attendant upon forming OTP/MTP cells. The problems are solved, inter alia, by forming a compact OTP/MTP cell on FDSOI or FinFET technology relative to known designs without requiring any additional masks.

Methodology in accordance with embodiments of the present disclosure includes forming a SOI region or a fin over a BOX layer over a substrate. A first gate stack and a second gate stack are formed, laterally separated, over respective portions of the SOI region or the fin, the first gate stack and the second gate stack each having an oxide/high-k layer and a polysilicon gate layer or a metal gate layer. A first liner and a second liner are formed along each first sidewall and second sidewall of the first gate stack and the second gate stack, respectively, the second sidewall over respective portions of the SOI region or the fin. A spacer is formed on each first liner and second liner and an S/D region is formed in the SOI region or the fin between the first gate stack and the second gate stack. A CA is formed over the S/D region. Each gate of the first gate stack and the second gate stack is utilized as a WL; and a BL is connected to the CA.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
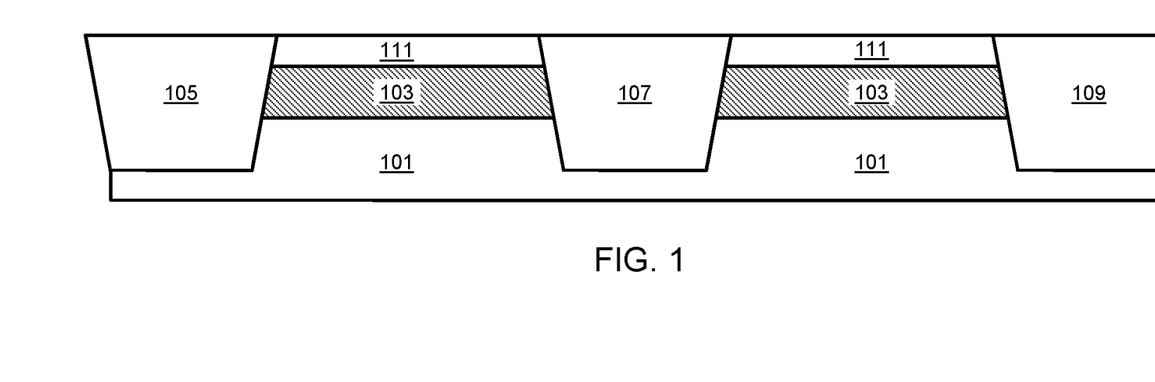
FIGS. 1 through 5 schematically illustrate cross-sectional views of a process flow for forming a compact FDSOI OTP/MTP cell, in accordance with an exemplary embodiment.

FIGS. 1 through 5 schematically illustrate cross-sectional views of a process flow for forming a compact FDSOI OTP/MTP cell, in accordance with an exemplary embodiment. Referring to FIG. 1, a substrate 101 is provided with a BOX layer 103, e.g., having a thickness of 10 nm to 100 nm. STI structures 105, 107, and 109 are then formed through the BOX layer 103 and a portion of the substrate 101, forming the SOI regions 111. The SOI regions 111 may each have a width of 60 nm to 120 nm and a length of 60 nm to 120 nm, e.g., 80 nm. Further, the SOI regions 111 may be formed, for example, 40 nm to 120 nm apart, e.g., 84 nm apart. A hybrid region and a well region (both not shown for illustrative convenience) may also be formed at this time.

Figure 2:
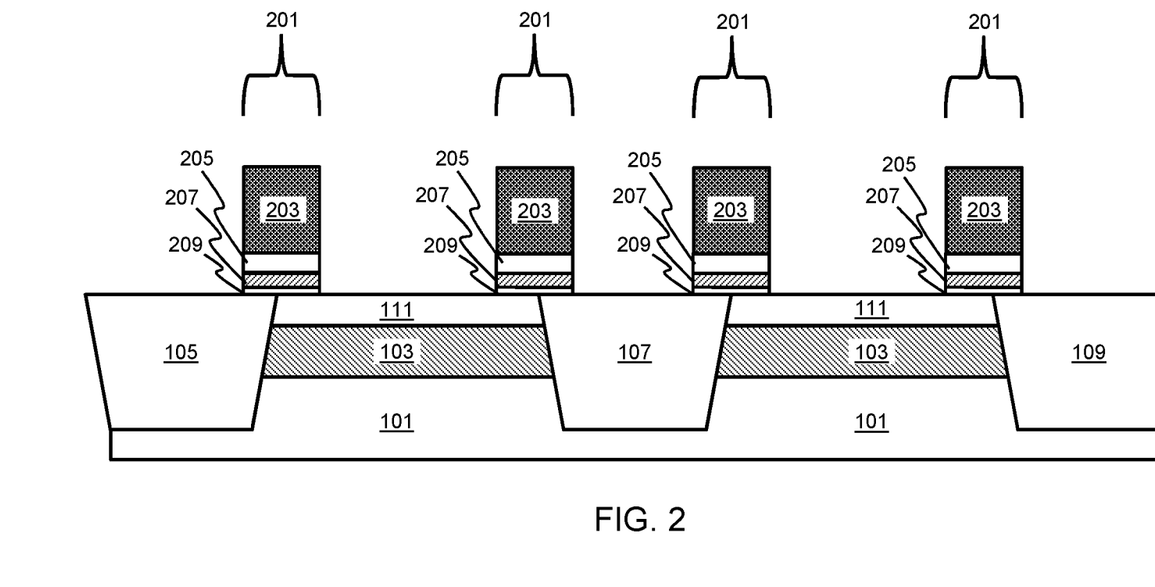

Referring to FIG. 2, a native oxide layer, an oxide/high-k layer, a metal layer, and a polysilicon layer (all not shown for illustrative convenience) are sequentially formed over the substrate 101. The native oxide layer may be formed, e.g., to a thickness of 5 angstrom (Å) to 10 Å. The oxide/high-k layer may be formed, e.g., of hafnium silicon oxynitride (HFSiON), hafnium oxide ($HfO_x$), tantalum oxide ($Ta_2O_3$), silicon oxide ($SiO_2$), silicon oxynitride, or the like to a thickness of 10 Å to 100 Å. The metal layer may be formed, e.g., of tantalum nitride (TaN), titanium nitride (TiN), tantalum nitride/aluminum/titanium nitride (TiN—Al—TiN), tungsten (W), or the like to a thickness of 10 Å to 50 Å, and the polysilicon layer may be formed, e.g., to a thickness of 200 Å to 1000 Å. Gate stacks 201 are then formed, e.g., by etching, through the polysilicon layer, the metal layer, the oxide/high-k layer, and the native oxide layer down to the SOI regions 111 and the STI structures 105, 107, and 109, forming the polysilicon gate layer 203, the metal layer 205, the oxide/high-k layer 207, and the native oxide layer 209.

Figure 3:
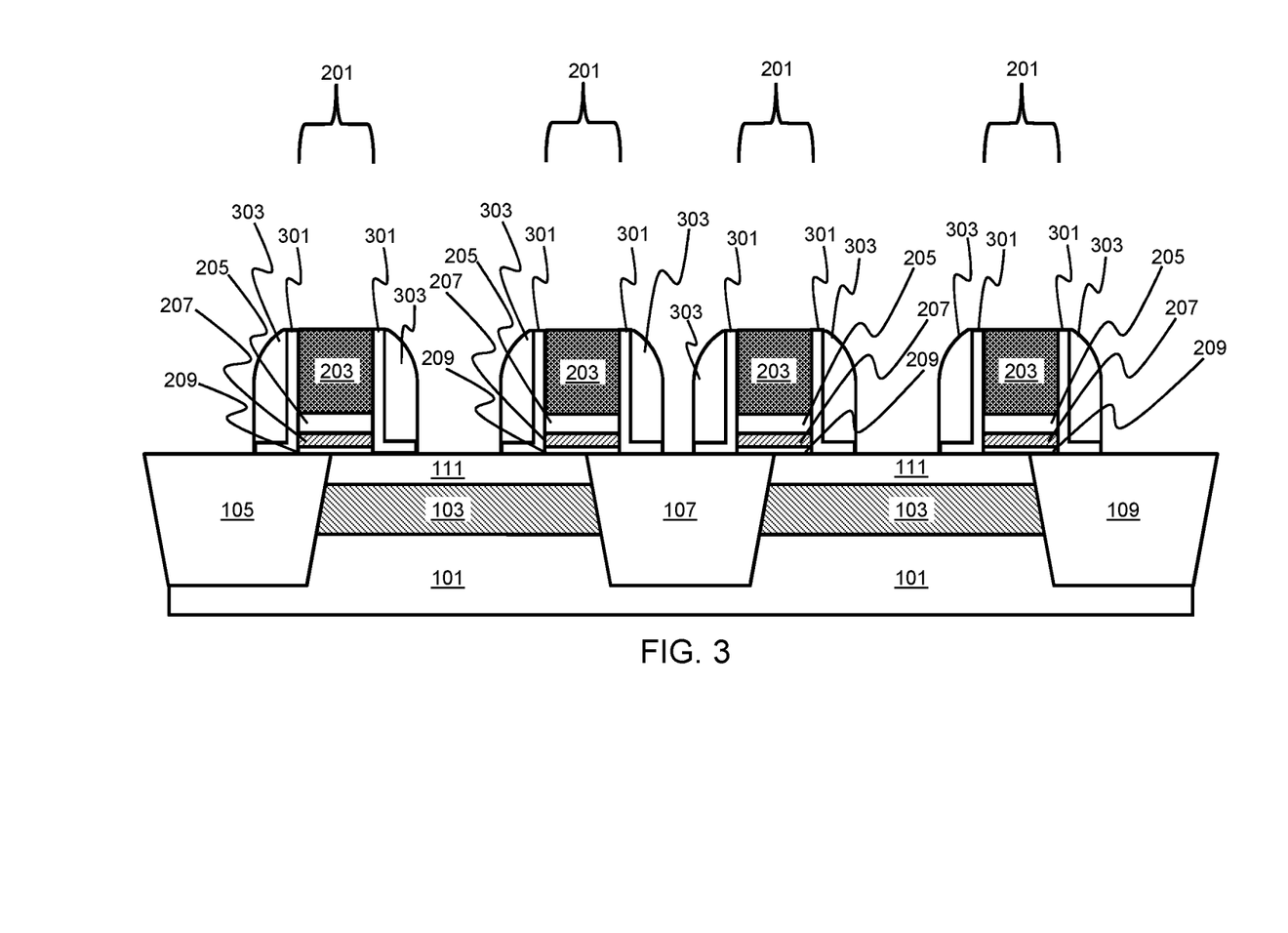

A liner 301 is then formed along each sidewall of the gate stacks 201, as depicted in FIG. 3. The liner 301 may be formed, e.g., in an L-shape or it may be formed as part of a reoxidation (reox) process. An optional lightly doped drain (LDD) region (not shown for illustrative convenience) may be formed in each SOI region 111 at or about the same time. Thereafter, a spacer 303 is formed over each liner 301.

Figure 4:
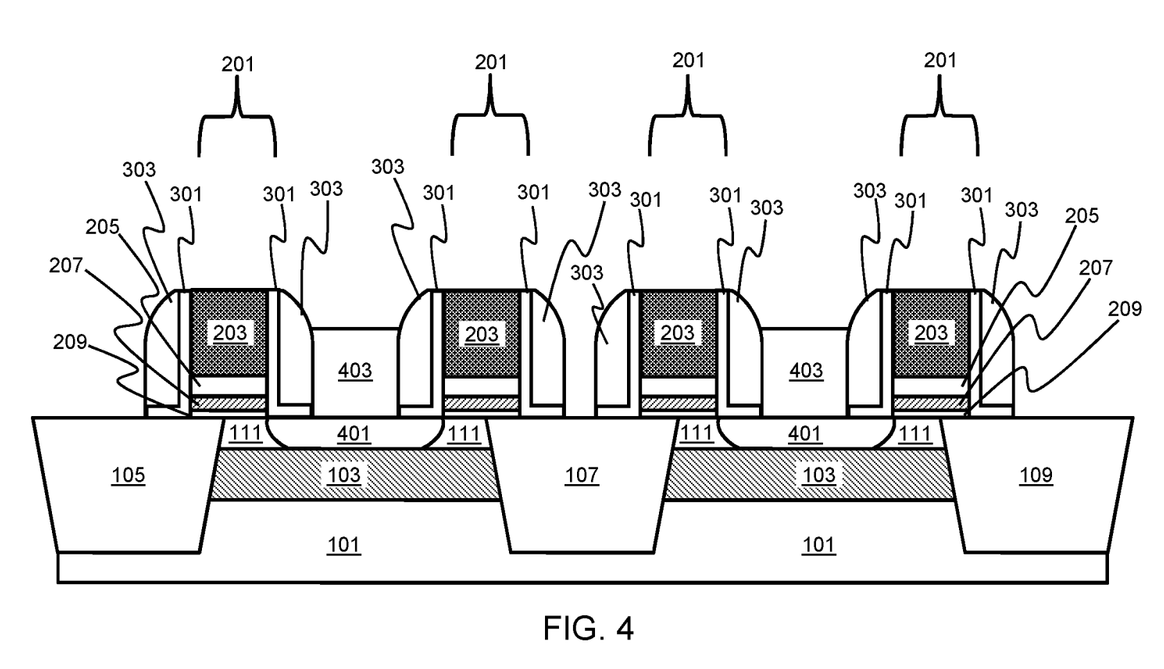

Next, an S/D region 401 is formed in each SOI region 111, as depicted in FIG. 4. The S/D region 401 may also include an optional RSD formation 403. The RSD formation 403 may be formed, e.g., by implants at the same time as the formation of the S/D region 401 or it may formed by in situ doped epitaxial growth.

Figure 5:
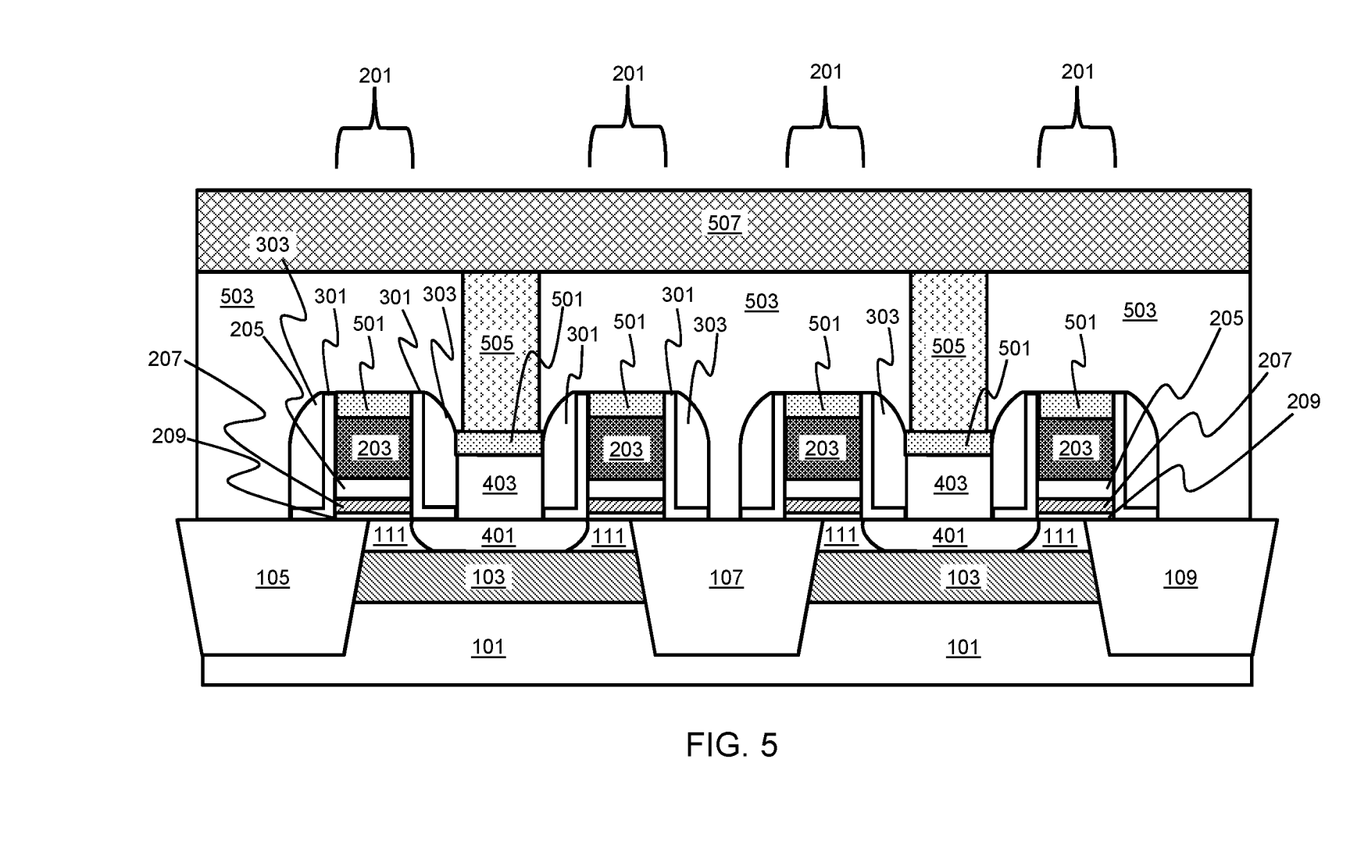

Referring to FIG. 5, a silicide layer 501 is formed on the polysilicon gate layer 203 of each gate stack 201 and the S/D region 401 or the optional RSD formation 403 such that the upper surface of the silicide layer 501 and the upper surface of the liners 301 are coplanar. An ILD layer 503 is then formed over the substrate 101 and planarized, e.g., by chemical mechanical polishing (CMP). Thereafter, a CA 505 is formed through the ILD 503 down to each S/D region 401 or optional RSD formation 403 and a BL 507 is connected to each CA 505. In this instance, each polysilicon gate layer 203 (gate) of the gate stack 201 is utilized as a WL. It should be understood that a row of CA 505 is connected to a BL 507, e.g., BL0 through BLn, and each CA 505 is formed between a pair of WL 203, e.g., WL0 through WLn, within the proposed layout (not shown for illustrative convenience).

Alternatively, the gate stacks 201 of FIG. 5 may be formed with a metal gate layer or a replacement metal gate (RMG) (not shown for illustrative convenience) instead of the polysilicon gate layer 203. In that instance, a thick oxide layer rather than the native oxide layer 209 and the oxide/high-k layer 207 is formed, e.g., to a thickness of 20 Å to 100 Å, over the substrate 101 and a dummy polysilicon layer instead of the metal layer 205 and the polysilicon layer 203 is formed, e.g., to a thickness of 200 Å to 1000 Å, over the thick oxide layer. The subsequent steps described above with respect to FIGS. 3 and 4 remain the same. Then, in this instance, after the ILD layer 503 of FIG. 5 is formed, the ILD layer 503 is planarized, e.g., by CMP, down to the dummy polysilicon layer. Next, the dummy polysilicon layer and the thick oxide layer are removed from each gate stack 201; the oxide/high-k layer 207 is formed in a U-shape over each SOI region 111 between the liners 301; and a metal gate or a RMG layer is formed within and completely filling the U-shaped oxide/high-k layer 207 (both not shown for illustrative convenience). Thereafter, an ILD layer (not shown for illustrative convenience) is formed over the substrate 101, planarized, e.g., by CMP, and the CA 505 and BL 507 are formed as described above.

The resultant device of FIG. 5 may exhibit the following bias properties depicted in Tables A and B; however, it should be noted that the bias properties depicted in Tables A and B are provided for illustration and are not intended as a limitation.

TABLE A

| OTP Bias Table (FIGS. 1 through 5) | | WL (V) | BL (V) |
|---|---|---|---|
| Prog. | Sel. | 2-4 | 0 |
|  | Unsel. | 0 | F |
| Read | Sel. | VDD | 0 |
|  | Unsel. | 0 | F |

TABLE B

| MTP Bias Table (FIGS. 1 through 5) | | WL (V) | BL (V) |
|---|---|---|---|
| Prog. | Sel. | 2-4 | 0 |
| (Set/Forming) | Unsel. | 0 | F |
| Erase (Opt 1: Unipolar Reset) | Sel. | 1-2 | 0 |
|  | Unsel. | 0 | F |
| Erase (Opt 2: Bipolar Reset) | Sel. | 0 | 1-2 |
|  | Unsel. | F | 0 |
| Read | Sel. | VDD | 0 |
|  | Unsel. | 0 | F |

Figure 6:
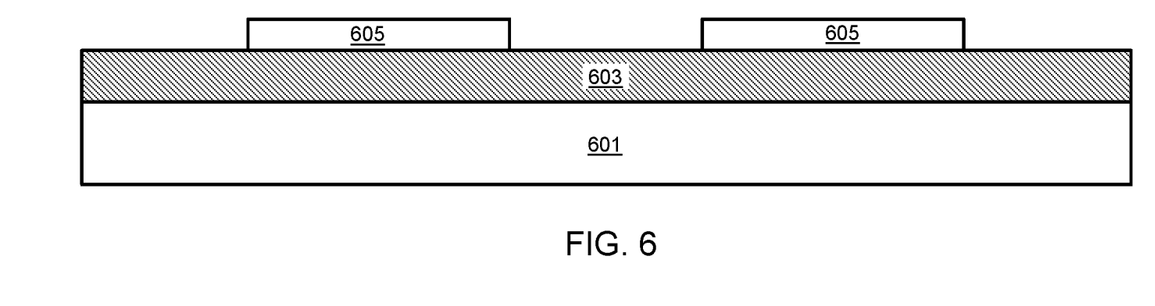
FIGS. 6 through 10 schematically illustrate cross-sectional views of a process flow for forming a compact FinFET OTP/MTP cell, in accordance with an exemplary embodiment.

FIGS. 6 through 10 schematically illustrate cross-sectional views of a process flow for forming a compact FinFET OTP/MTP cell, in accordance with an exemplary embodiment. Referring to FIG. 6, a substrate 601 is provided with a BOX layer 603, e.g., having a thickness of 10 nm to 100 nm. Thereafter, fins 605 are formed, e.g., with a width of 60 nm to 120 nm and a length of 60 nm to 120 nm, e.g., 80 nm, laterally separated, for example, 40 nm to 120 nm apart, e.g., 84 nm apart, over the BOX layer 603.

Figure 7:
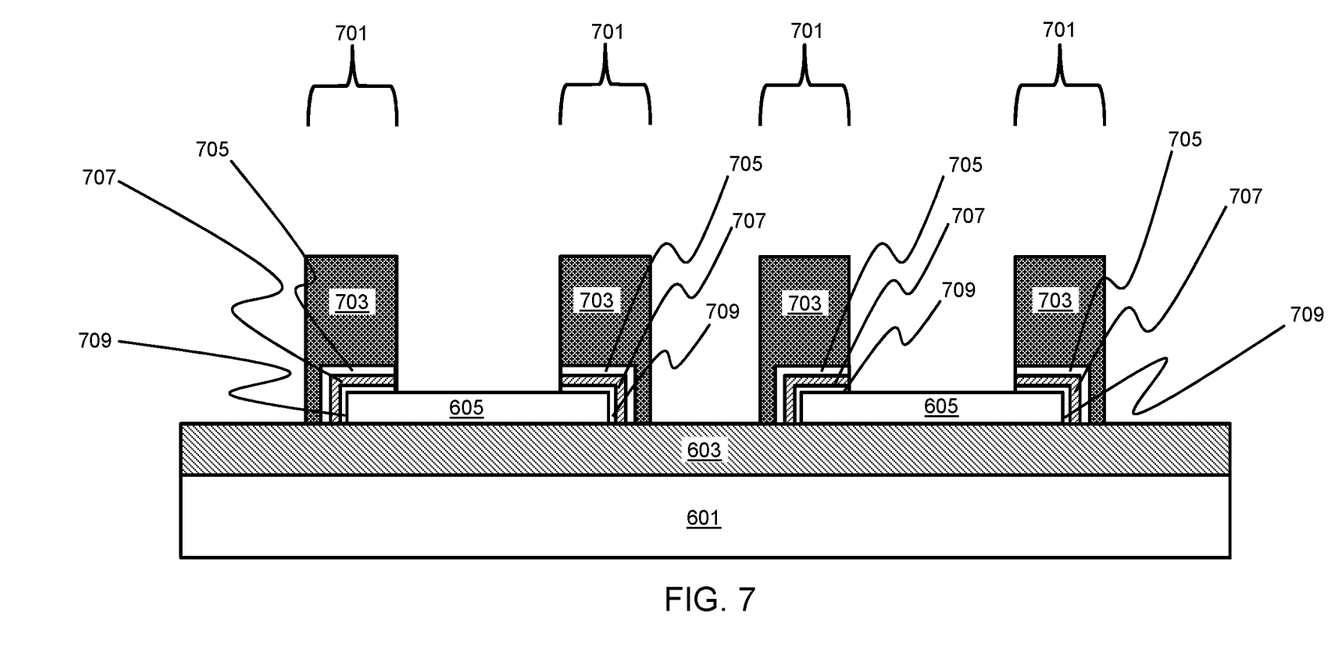

Referring to FIG. 7, a native oxide, an oxide/high-k layer, a metal layer, and a polysilicon layer (all not shown for illustrative convenience) are sequentially formed over the substrate 601 and along opposite sidewalls of each fin 605. The native oxide layer may be formed, e.g., to a thickness of 5 Å to 10 Å. The oxide/high-k layer may be formed, e.g., of HFSiON, $HfO_x$, $Ta_2O_3$, $SiO_2$, silicon oxynitride, or the like to a thickness of 10 Å to 100 Å. The metal layer may be formed, e.g., of TaN, TiN, TiN—Al—TiN, W, or the like to a thickness of 10 Å to 50 Å, and the polysilicon layer may be formed, e.g., to a thickness of 200 Å to 1000 Å. Gate stacks 701 are then formed, e.g., by etching, through the polysilicon layer, the metal layer, the oxide/high-k layer, and the native oxide layer down to the BOX layer 603 and the fins 605, forming the polysilicon gate layer 703, the metal layer 705, the oxide/high-k layer 707, and the native oxide layer 709, i.e., each gate stack 701 lands on an edge of a fin 605.

Figure 8:
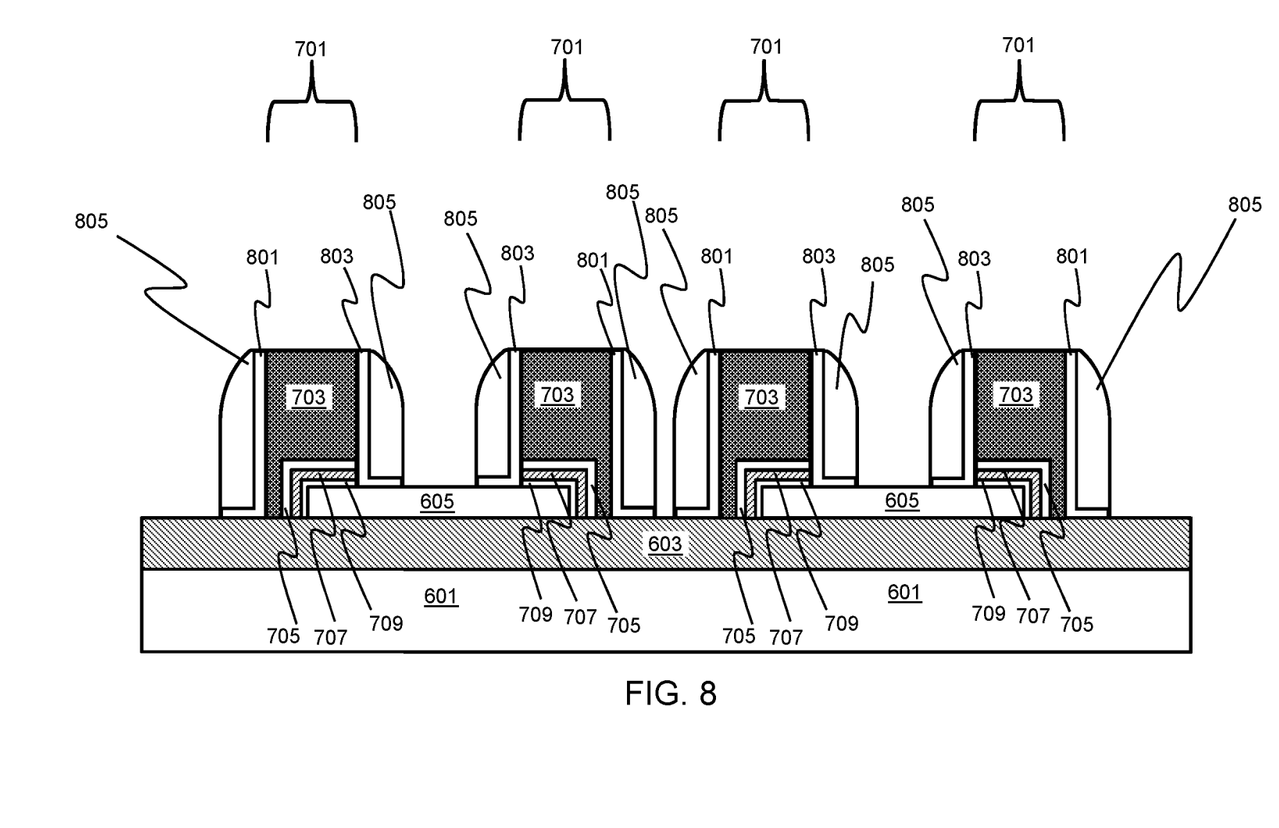

A liner 801 is then formed, e.g., in a L-shape or as part of a reox process along each outer or opposing sidewall of the gate stacks 701 and on respective portions of the BOX layer 603 and a liner 803 is formed, e.g., in a L-shape or as part of a reox process, along each inner or facing sidewall of the gate stacks 701 and on respective portions of the fins 605, as depicted in FIG. 8. An optional LDD region (not shown for illustrative convenience) may be formed in each fin 605 at or about the same time. Thereafter, a spacer 805 is formed over each liner 801 and 803.

Figure 9:
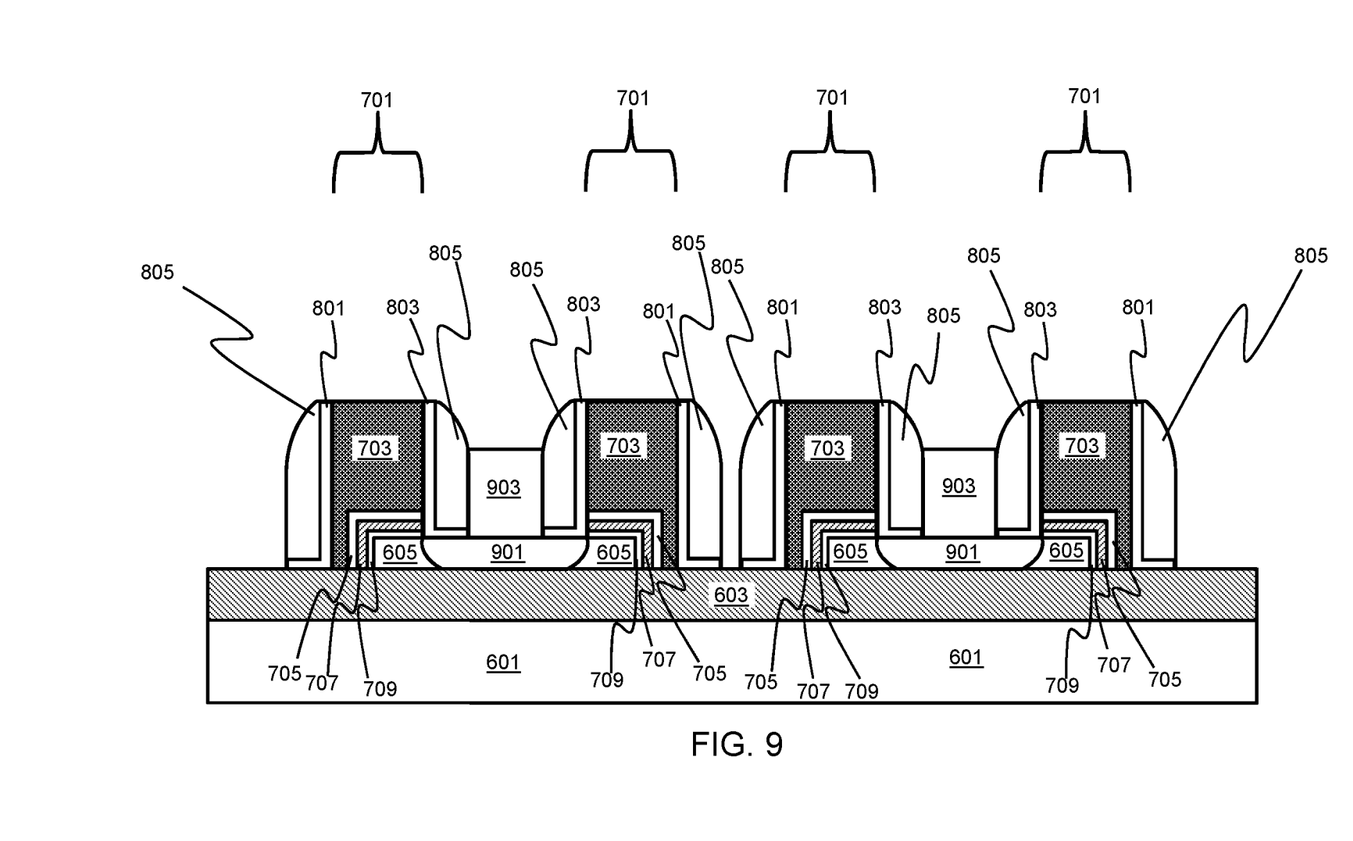

Next, an S/D region 901 is formed in each fin 605, as depicted in FIG. 9. The S/D region 901 may also include an optional RSD formation 903. The RSD formation 903 may be formed, e.g., by implants at the same time as the formation of the S/D region 901 or it may formed by in situ doped epitaxial growth.

Figure 10:
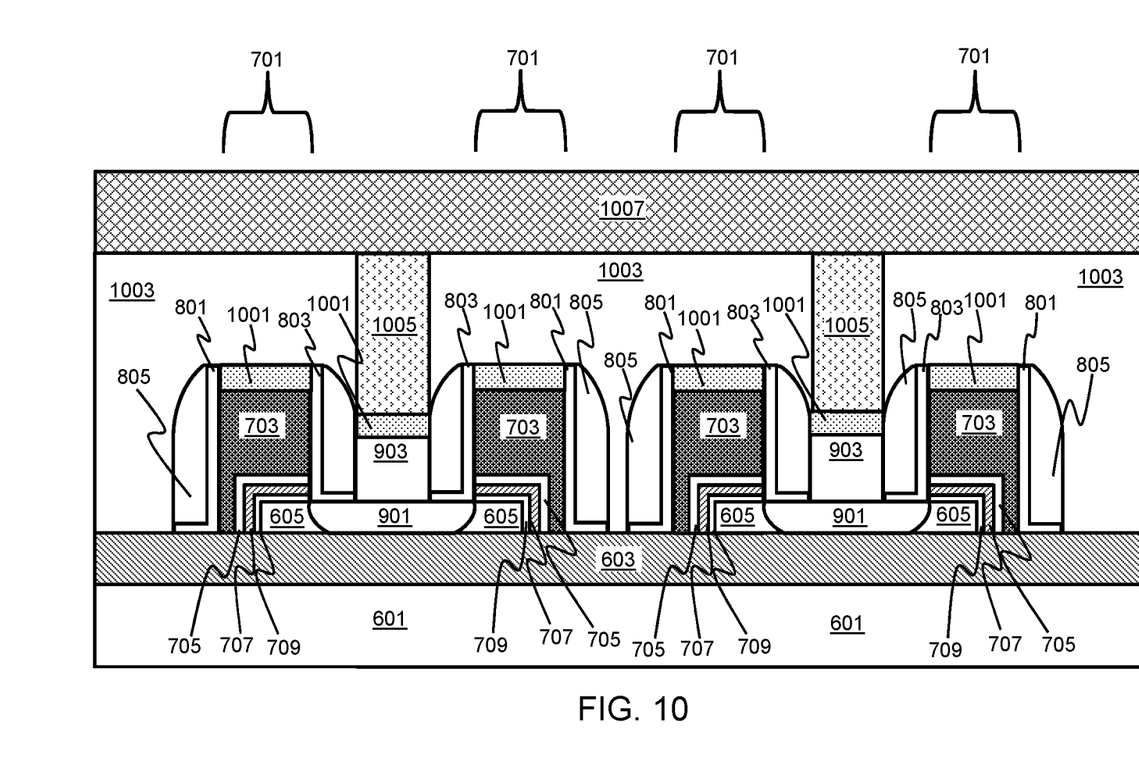

Referring to FIG. 10, a silicide layer 1001 is formed on the polysilicon gate layer 703 of each gate stack 701 and the S/D region 901 or the optional RSD formation 903 such that the upper surface of the silicide layer 1001 and the upper surface of the liners 801 and 803 are coplanar. An ILD layer 1003 is then formed over the substrate 601 and planarized, e.g., by CMP. Thereafter, a CA 1005 is formed through the ILD 1003 down to each S/D region 901 or optional RSD formation 903 and a BL 1007 is connected to each CA 1005. In this instance, each polysilicon gate layer 703 (gate) of the gate stack 701 is utilized as a WL. It should be understood that a row of CA 1005 is connected to a BL 1007, e.g., BL0 through BLn, and each CA 1005 is formed between a pair of WL 703, e.g., WL0 through WLn, within the proposed layout (not shown for illustrative convenience).

Alternatively, the gate stacks 701 of FIG. 10 may be formed with a metal gate layer or a replacement metal gate (RMG) (not shown for illustrative convenience) instead of the polysilicon gate layer 703. In that instance, a thick oxide layer rather than the native oxide layer 709 and the oxide/high-k layer 707 is formed, e.g., to a thickness of 20 Å to 100 Å, over the substrate 601 and along opposite sidewalls of each fin 605. A dummy polysilicon layer instead of the metal layer 705 and the polysilicon layer 703 is then formed, e.g., to a thickness of 200 Å to 1000 Å, over and along opposite sidewalls of the thick oxide layer. The subsequent steps described above with respect to FIGS. 8 and 9 remain the same. Then, in this instance, after the ILD layer 1003 of FIG. 10 is formed, the ILD layer 1003 is planarized, e.g., by CMP, down to the dummy polysilicon layer. Next, the dummy polysilicon layer and the thick oxide layer are removed from each gate stack 701; the oxide/high-k layer 707 is formed in a U-like shape over each fin 605 between the liners 801 and 803; and a metal gate or a RMG layer is formed within and completely filling the U-like-shaped oxide/high-k layer 707 (both not shown for illustrative convenience). Thereafter, an ILD layer (not shown for illustrative convenience) is formed over the substrate 601, planarized, e.g., by CMP, and the CA 1005 and BL 1007 are formed as described above.

The embodiments of the present disclosure can achieve several technical effects such as forming an OTP/MTP on FDSOI or FinFET architecture that can alleviate program disturb while realizing a compact cell size greater than 50% smaller than known designs, e.g., a 20-30 feature size squared ($F^2$) versus 47-50 $F^2$ (28 nm OTP) or 298 $F^2$ (16 nm MTP), without requiring any additional masks, i.e., at a low cost. In addition, oxide or high-k can be used for OTP or MTP, an anti-fuse or breakdown region may be formed through the oxide/high-k layer, and the high-k layer can be utilized as ReRAM for MTP (>10 cycles). Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore has industrial applicability in any IC devices with OTP or MTP memory devices on FDSOI or FinFET architecture.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a silicon-on-insulator (SOI) region or a fin over a buried oxide (BOX) layer over a substrate;
    a first shallow trench isolation (STI) structure and a second STI structure through the BOX layer and a portion of the substrate on opposite sides of the SOI region;
    a first gate stack and a second gate stack, laterally separated, over respective portions of the SOI region or the fin, the first gate stack and the second gate stack having:
        a first native oxide layer and a second native oxide layer, respectively;
        a first oxide/high-k layer and a second oxide/high-k layer over the first native oxide layer and the second native oxide layer, respectively;
        a first metal layer and a second metal layer over the first oxide/high-k layer and the second/high-k layer, respectively;
        a first polysilicon gate layer and a second polysilicon gate layer over the first metal layer and the second metal layer, respectively; and
        a first silicide layer and a second silicide layer over the first polysilicon gate layer and the second polysilicon gate layer, respectively;
    a first liner and a second liner along each first sidewall and second sidewall of the first gate stack and the second gate stack, respectively, the second sidewall over respective portions of the SOI region or the fin;
    a spacer on each first liner and second liner;
    a source/drain (S/D) region in the SOI region or the fin between the first gate stack and the second gate stack;
    an interlayer dielectric (ILD) layer over the substrate;
    a source/drain contact (CA) through a portion of the ILD over the S/D region; and
    a bit line (BL) connected to the CA,
    wherein a portion of the first polysilicon gate extends over a portion of the first STI structure and a portion of the second first polysilicon gate extends over a portion of the first STI structure.

2. The device according to claim 1, wherein
    the first gate stack and a first liner are over a portion of the first STI structure and the second gate stack and a first liner are over a portion of the second STI structure.

3. The device according to claim 2, wherein
    the first native oxide layer and the second native oxide layer are disposed over the portion of the first STI structure and the portion of the second STI structure, respectively, and
    the first silicide layer and the second silicide layer are coplanar with an upper surface of the first liner and the second liner.

4. The device according to claim 1, wherein the fin is formed, the device further comprising:
    the first gate stack and the second gate stack adjacent to a first sidewall and a second sidewall of the fin, respectively, the first sidewall and the second sidewall on opposite sides of the fin.

5. The device according to claim 4, wherein the first gate stack and the second gate stack each further comprise:
    a first native oxide layer and a second native oxide layer adjacent to the first sidewall and the second sidewall of the fin, respectively, and over respective portions of the fin;
    the first oxide/high-k layer and the second oxide/high-k layer over and along the first native oxide layer and the second native oxide layer, respectively;
    a first metal layer and a second metal layer over and along the first oxide/high-k layer and the second/high-k layer, respectively;
    a first polysilicon gate layer and a second polysilicon gate layer over and along the first metal layer and the second metal layer, respectively; and
    a first silicide layer and a second silicide layer over the first polysilicon gate layer and the second polysilicon gate layer, respectively, the first silicide layer and the second silicide layer coplanar with an upper surface of the first liner and the second liner.

6. The device according to claim 1, further comprising a raised source/drain (RSD) between the S/D region and the CA.

* * * * *